US008895383B2

(12) United States Patent
Lee et al.

(10) Patent No.: US 8,895,383 B2
(45) Date of Patent: Nov. 25, 2014

(54) MULTIPLE-GATE SEMICONDUCTOR DEVICE AND METHOD

(71) Applicant: Taiwan Semiconductor Manufacturing Company, Ltd., Hsin-Chu (TW)

(72) Inventors: Tung Ying Lee, Hsin-Chu (TW); Li-Wen Weng, Zhunan Township (TW); Chien-Tai Chan, Hsin-Chu (TW); Da-Wen Lin, Hsin-Chu (TW); Hsien-Chin Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 13/863,963

(22) Filed: Apr. 16, 2013

(65) Prior Publication Data

US 2013/0230958 A1 Sep. 5, 2013

Related U.S. Application Data

(62) Division of application No. 12/797,382, filed on Jun. 9, 2010, now Pat. No. 8,426,923.

(60) Provisional application No. 61/266,009, filed on Dec. 2, 2009.

(51) Int. Cl.
*H01L 21/8238* (2006.01)
*H01L 27/088* (2006.01)
*H01L 21/8234* (2006.01)
*H01L 29/66* (2006.01)
*H01L 29/78* (2006.01)

(52) U.S. Cl.
CPC ...... *H01L 29/66795* (2013.01); *H01L 27/0886* (2013.01); *H01L 21/823431* (2013.01); *H01L 29/785* (2013.01)

USPC .......................................................... 438/222

(58) Field of Classification Search
None
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,358,121 B2 | 4/2008 | Chau et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,692,254 B2 | 4/2010 | Anderson et al. | |
| 7,701,018 B2 | 4/2010 | Yamagami et al. | |
| 7,932,551 B2 | 4/2011 | Kim et al. | |
| 7,993,988 B2 | 8/2011 | Juengling | |
| 7,994,020 B2 | 8/2011 | Lin et al. | |
| 8,110,466 B2 | 2/2012 | Shieh et al. | |
| 8,110,467 B2 | 2/2012 | Chang et al. | |
| 8,367,498 B2 * | 2/2013 | Chang et al. | 438/268 |
| 8,440,517 B2 * | 5/2013 | Lin et al. | 438/197 |

(Continued)

*Primary Examiner* — Benjamin Sandvik
(74) *Attorney, Agent, or Firm* — Slater & Matsil, LLP

(57) ABSTRACT

A system and method for manufacturing multiple-gate semiconductor devices is disclosed. An embodiment comprises multiple fins, wherein intra-fin isolation regions extend into the substrate less than inter-fin isolation regions. Regions of the multiple fins not covered by the gate stack are removed and source/drain regions are formed from the substrate so as to avoid the formation of voids between the fins in the source/drain region.

20 Claims, 11 Drawing Sheets

(56) References Cited

U.S. PATENT DOCUMENTS

| | | |
|---|---|---|
| 2005/0153490 A1 | 7/2005 | Yoon et al. |
| 2006/0134868 A1 | 6/2006 | Yoon et al. |
| 2007/0090443 A1 | 4/2007 | Choi et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0221956 A1* | 9/2007 | Inaba ............................ 257/197 |
| 2008/0067613 A1 | 3/2008 | Anderson et al. |
| 2008/0290470 A1 | 11/2008 | King et al. |
| 2008/0296632 A1 | 12/2008 | Moroz et al. |
| 2009/0096002 A1 | 4/2009 | Yu et al. |
| 2009/0152589 A1 | 6/2009 | Rakshit et al. |
| 2009/0181477 A1 | 7/2009 | King et al. |
| 2012/0049294 A1 | 3/2012 | Chen et al. |
| 2012/0091538 A1 | 4/2012 | Lin et al. |

\* cited by examiner

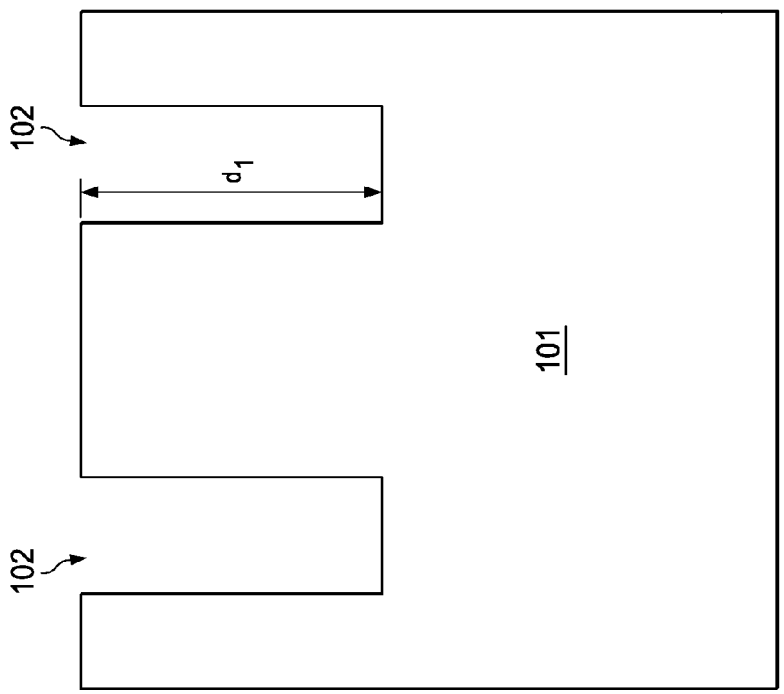
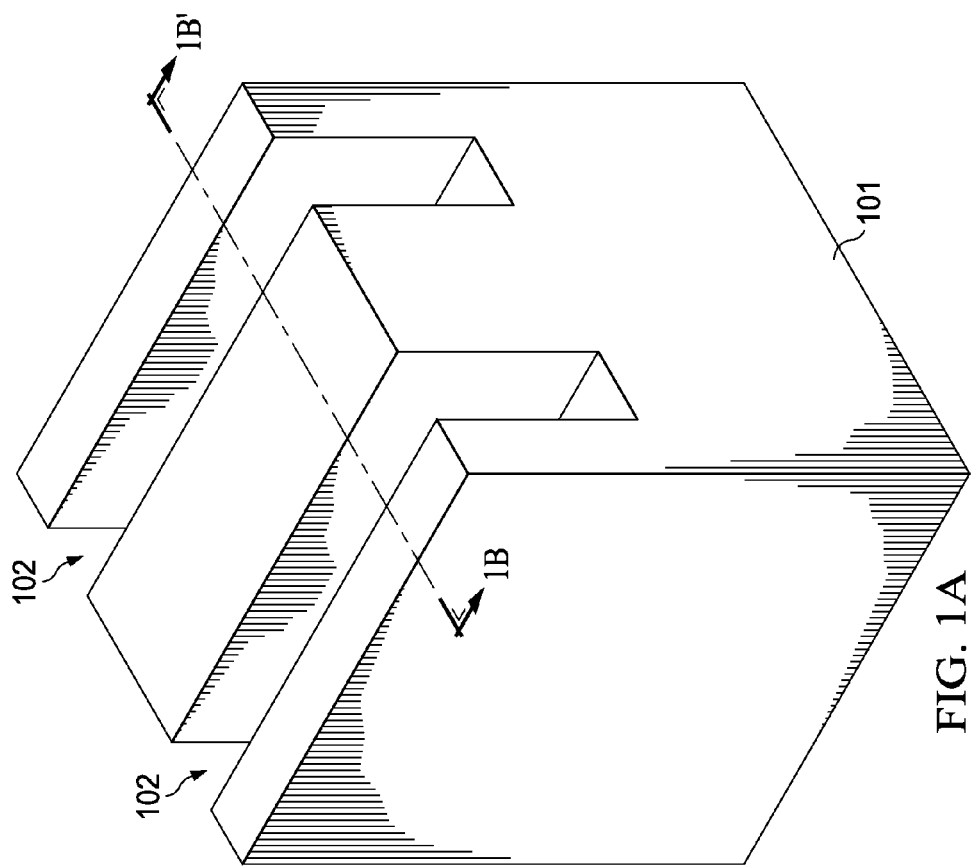
FIG. 1B
FIG. 1A

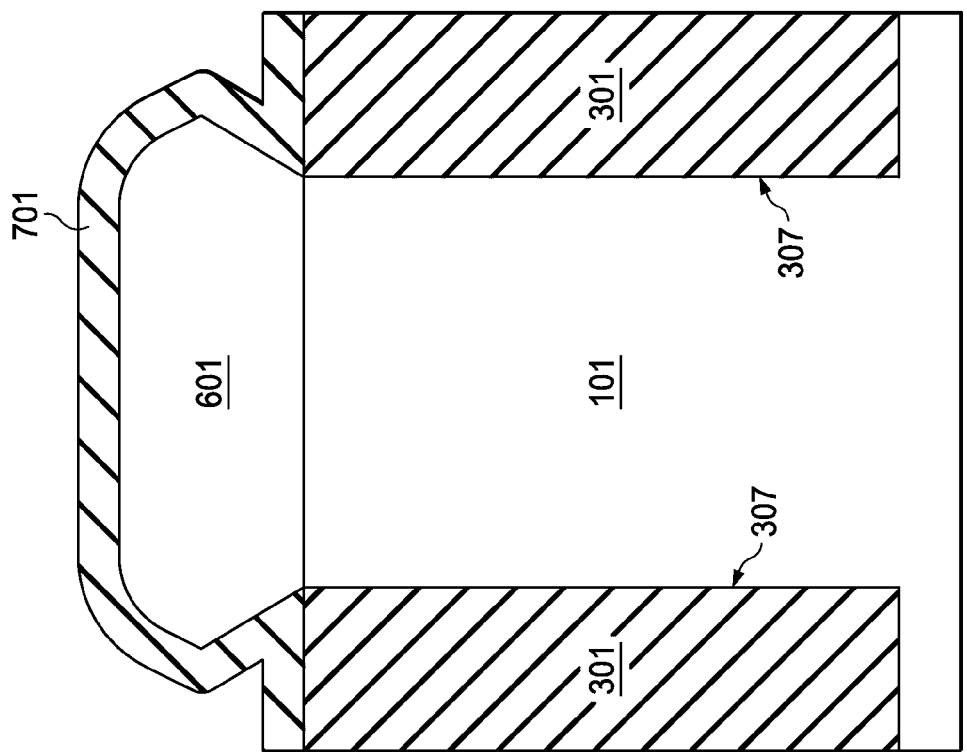
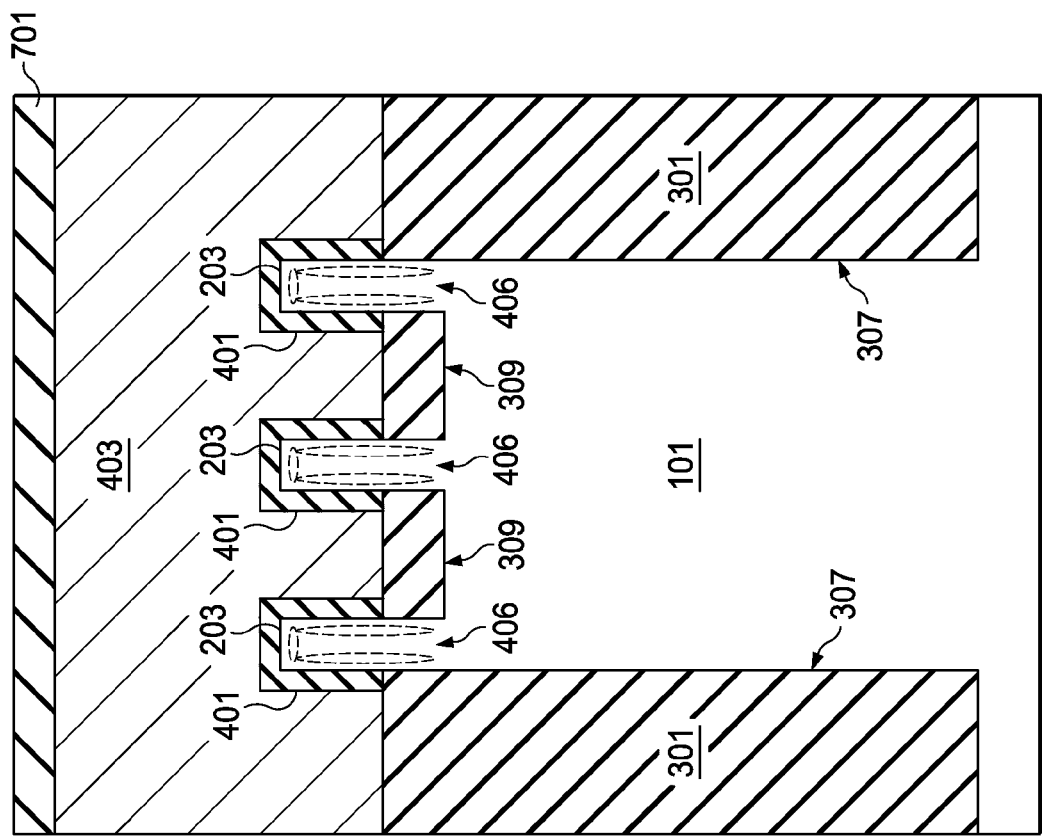
FIG. 7B
FIG. 7C

MULTIPLE-GATE SEMICONDUCTOR DEVICE AND METHOD

This application claims the benefit of U.S. patent application Ser. No. 12/797,382, entitled "Multiple-Gate Semiconductor Device and Method," filed on Jun. 9, 2010, which claims the benefit of U.S. Provisional Patent Application Ser. No. 61/266,009, filed on Dec. 2, 2009, and entitled "Multiple-Gate Semiconductor Device and Method," which applications are incorporated herein by reference.

TECHNICAL FIELD

The present invention relates generally to semiconductor devices and, more particularly, to FinFET semiconductor devices.

BACKGROUND

In the race to improve transistor performance as well as reduce the size of transistors, transistors have been developed that do not follow the traditional planar format, such that the channel and source/drain regions are located in a fin formed from the bulk substrate. One such non-planar device is a multiple-gate FinFET. In its simplest form, a multiple-gate FinFET has a gate electrode that straddles across a fin-like silicon body to form a channel region. In this configuration, there are at least two gates, one on each sidewall of the silicon fin.

In an effort to improve the performance of the multiple-gate FinFET, stress may be generated in the channel region of the substrate between the source/drain regions by removing the fins and then regrowing the fins with a different material. However, in FinFET devices where multiple channels may share a common gate electrode, the closeness of the fins during regrowth causes voids to form in between the re-grown source/drain regions as there is not enough space between the regrown source/drain regions to allow subsequently formed layers (such as a contact etch stop layer) to fill the small regions between the re-grown source/drain regions. These voids where there is no re-grown source/drain to cause stress may decrease the overall potential performance of the device.

As such, what is needed is a structure (and method to form the structure) that allows for a larger stress level and for better control of the stress that may be applied to the channel regions of a FinFET device.

SUMMARY OF THE INVENTION

These and other problems are generally solved or circumvented, and technical advantages are generally achieved, by embodiments of the present invention which are directed towards a FinFET structure with a common source/drain region along with inter-fin and intra-fin isolation regions with differing heights.

In accordance with an embodiment of the present invention, a semiconductor device comprises a substrate comprising a first fin and a second fin. A first isolation region is located between the first fin and the second fin. A second isolation region is located opposite the first fin from the first isolation region, the second isolation region extending into the substrate further than the first isolation region. A continuous source/drain region extends from the first fin to the second fin.

In accordance with another embodiment of the present invention, a semiconductor device comprises a substrate comprising a plurality of fins. A first multiple-gate transistor is formed from a first one of the plurality of fins and a second multiple-gate transistor is formed from a second one of the plurality of fins, wherein the first multiple-gate transistor and second multiple-gate transistor share a source/drain region. A first isolation region is located between the first multiple-gate transistor and the second multiple-gate transistor, the first isolation region extending into the substrate a first distance. A second isolation region is located adjacent the first multiple-gate transistor and outside of the region between the first multiple-gate transistor and the second multiple-gate transistor, the second isolation region extending into the substrate a second distance greater than the first distance.

In accordance with yet another embodiment of the present invention, a method of forming a semiconductor device comprises providing a substrate and forming a plurality of fins in the substrate. First isolation regions are formed in the substrate, the first isolation regions extending a first depth from a surface of the substrate. Second isolation regions are formed in the substrate, the second isolation regions extending a second depth from the surface of the substrate, the second depth being less than the first depth. A gate dielectric, gate electrode, and spacers are formed over a first portion of each of the semiconductor fins and the second isolation regions while leaving a second portion of each of the semiconductor fins and the second isolation regions exposed. The second portion of each of the semiconductor fins and the second isolation regions are removed, and a source/drain region is formed, the source/drain region connecting the plurality of semiconductor fins.

In accordance with another embodiment, a method of forming a semiconductor device comprising providing a substrate and forming a plurality of fins in the substrate is provided. First isolation regions are formed in the substrate, the first isolation regions extending a first depth from a surface of the substrate and second isolation regions are formed in the substrate, the second isolation regions extending a second depth from the surface of the substrate, the second depth being less than the first depth. A gate dielectric, gate electrode, and spacers are formed over a first portion of each of the semiconductor fins and the second isolation regions while leaving a second portion of each of the semiconductor fins and the second isolation regions exposed. The second portion of each of the semiconductor fins and the second isolation regions is removed, and a source/drain region is formed, the source/drain region connecting the plurality of semiconductor fins and extending below a top surface of the second isolation regions.

In accordance with another embodiment, a method of forming a semiconductor device comprising forming a first isolation region in a substrate between a first fin and a second fin and forming a second isolation region in the substrate on an opposite side of the first fin from the first isolation region, wherein the second isolation region extends further into the substrate than the first isolation region, is provided. A gate stack is formed over the first fin and the second fin and an exposed first portion of the first fin and an exposed second portion of the second fin are removed, wherein the removing the exposed first portion of the first fin continues until the first portion of the first fin is below a top surface of the first isolation region. A continuous source/drain region is grown extending from the first fin to the second fin.

In accordance with another embodiment, a method of forming a semiconductor device comprising depositing dielectric material into a first opening and a second opening, wherein the first opening is located between a first fin and a second fin and wherein the second opening is not located between the first fin and the second fin, the first opening extending into the substrate less than the second opening is provided. The dielectric material is recessed such that sidewalls of the first fin and the second fin are exposed and a gate stack is formed over the first fin and the second fin. The dielectric material is removed from a first region in the first opening exposed by the gate stack, and a source/drain region is grown within the first region, the source/drain region extending between the first fin and the second fin.

An advantage of an embodiment of the present invention is that voids between the fins may be avoided, thereby increasing the stress that may be applied to the channel of the multiple-gate transistors.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-3B illustrate various perspective and cross-sectional views of the formation of first isolation regions and second isolation regions in a substrate in accordance with an embodiment;

FIGS. 7A-7C illustrate the formation of a contact etch stop layer in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 2B:
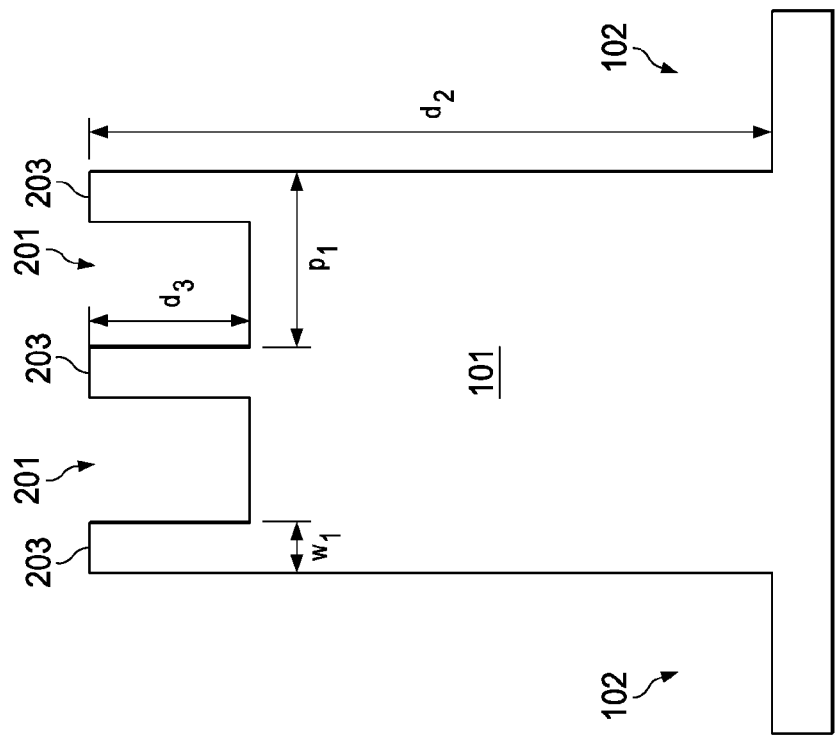

The making and using of the present embodiments are discussed in detail below. It should be appreciated, however, that the present embodiments provide many applicable inventive concepts that can be embodied in a wide variety of specific contexts. The specific embodiments discussed are merely illustrative of specific ways to make and use the embodiments, and do not limit the scope of the invention.

The present invention will be described with respect to embodiments in a specific context, namely a FinFET transistor. The invention may also be applied, however, to other semiconductor devices, particularly non-planar devices. For example, embodiments of the present invention may be utilized with non-planar resistors, diodes, and the like.

With reference now to FIGS. 1A and 1B, which show a perspective view and a cross-sectional view, respectively, there is shown a substrate 101 with first trenches 102 formed therein. The substrate 101 may be a silicon substrate, although other substrates, such as semiconductor-on-insulator (SOI), strained SOI, and silicon germanium on insulator, could alternatively be used. The substrate 101 may be a p-type semiconductor, although in other embodiments, it could alternatively be an n-type semiconductor.

The first trenches 102 may be formed as an initial step in the eventual formation of shallow trench isolation regions (described below with respect to FIGS. 3A-3B). The first trenches 102 may be formed using a masking layer (not shown) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer may be patterned through a suitable photolithographic process to expose those portions of the substrate 101 that will be removed to form the first trenches 102.

As one of skill in the art will recognize, however, the processes and materials described above to form the masking layer are not the only method that may be used to protect portions of the substrate 101 while exposing other portions of the substrate 101 for the formation of the first trenches 102. Any suitable process, such as a patterned and developed photoresist, may alternatively be utilized to expose portions of the substrate 101 to be removed to form the trenches 102. All such methods are fully intended to be included in the scope of the present invention.

Once a masking layer has been formed and patterned, the first trenches 102 are formed in the substrate 101. The exposed substrate 101 may be removed through a suitable process such as reactive ion etching (RIE) in order to form the first trenches 102 in the substrate 101, although other suitable processes may alternatively be used. In an embodiment, the first trenches 102 may be formed to have a first depth $d_1$ be less than about 5,000 Å from the surface of the substrate 101, such as about 2,500 Å. As explained below with respect to FIGS. 2A-2B, the area of the substrate 101 between the first trenches 102 is subsequently patterned to form individual fins of the FinFET.

Figure 2A:
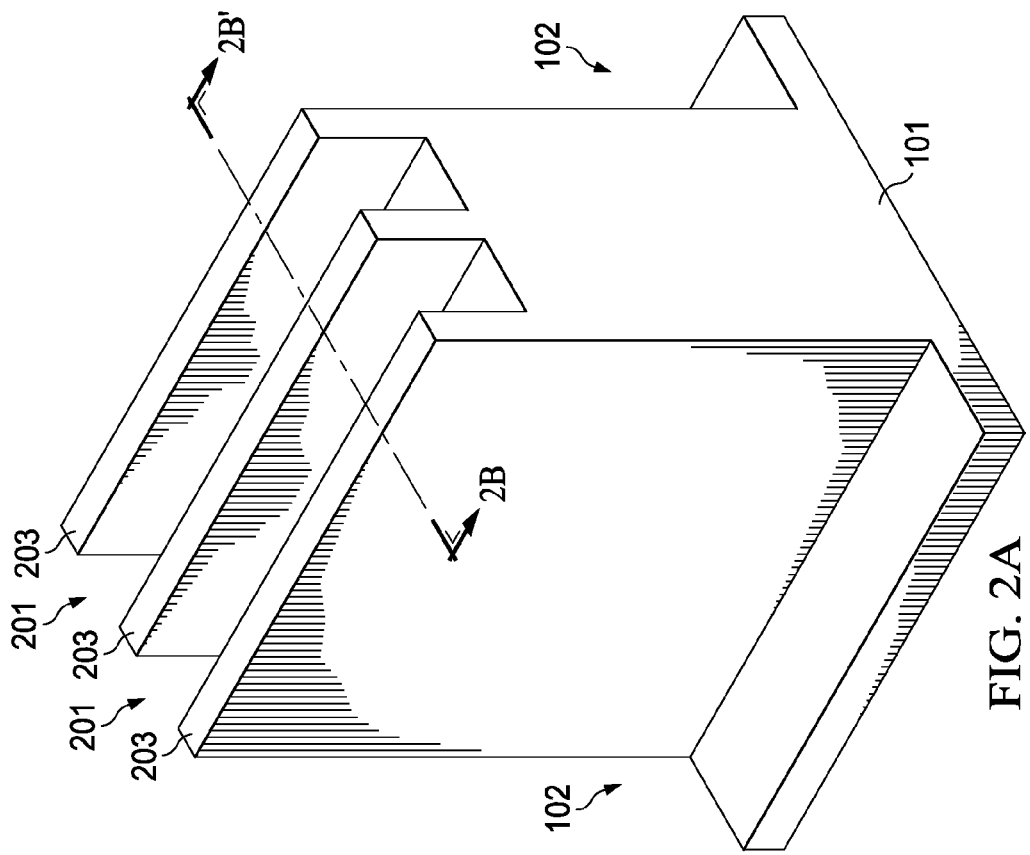

FIGS. 2A-2B illustrate the formation of fins 203 along with second trenches 201. For the sake of clarity, FIGS. 2A-2B have been enlarged from FIGS. 1A-1B to show the interior of the first trenches 102. The second trenches 201 are located between the first trenches 102, and are intended to be intra-Fin isolation regions, such as isolation regions between separate fins 203 that share either a similar gate or similar sources or drains. As such, while the second trenches 201 may be intra-Fin isolation regions, the first trenches 102 may be inter-Fin isolation regions located between fins that do not share a similar gate, source, or drain.

The second trenches 201 may be formed using a similar process as the first trenches 102 (discussed above with respect to FIG. 1) such as a suitable masking or photolithography process followed by an etching process. Additionally, the formation of the second trenches 201 may also be used to deepen the first trenches 102, such that the first trenches 102 extend into the substrate 101 a further distance than the second trenches 201. This may be done by using a suitable mask to expose both the first trenches 102 as well as those areas of the substrate 101 that will be removed to form the second trenches 201. As such, the first trenches 102 may have a final second depth $d_2$ of between about 200 Å and about 7,000 Å, such as about 3,190 Å, and the second trenches 201 may be formed to have a third depth $d_3$ of between about 100 Å and about 1,500 Å, such as about 1,000 Å.

However, as one of ordinary skill in the art will recognize, the process described above to form inter-fin first trenches 102 and intra-fin second trenches 201 is merely one potential process, and is not meant to be the only embodiment. Rather, any suitable process through which first trenches 102 and second trenches 201 may be formed such that the inter-fin first trenches 102 extend into the substrate 101 further than the intra-fin second trenches 201 may be utilized. For example, the first trenches 102 may be formed in a single etch step and then protected during the formation of the second trenches 201. Any suitable process, including any number of masking and removal steps may alternatively be used.

In addition to forming the second trenches 201, the masking and etching process additionally forms fins 203 from those portions of the substrate 101 that remain unremoved. These fins 203 may be used, as discussed below, to form the channel region of multiple-gate FinFET transistors. While FIG. 2 only illustrates three fins 203 formed from the substrate 101, any number of fins 203 that are greater than one may be utilized such that there are intra-fin second trenches 201 and inter-fin first trenches 102.

The fins 203 may be formed such that they have a first width $w_1$ at the surface of the substrate 101 of between about 5 nm and about 80 nm, such as about 30 nm. Additionally, the fins 203 may be formed such that they have a pitch $P_1$ of between about 30 nm and about 150 nm, such as about 90 nm. By spacing the fins 203 in such a fashion, the fins 203 may each form a separate channel region while still being close enough to share a common gate (whose formation is discussed below in relation to FIG. 4).

Figure 3B:
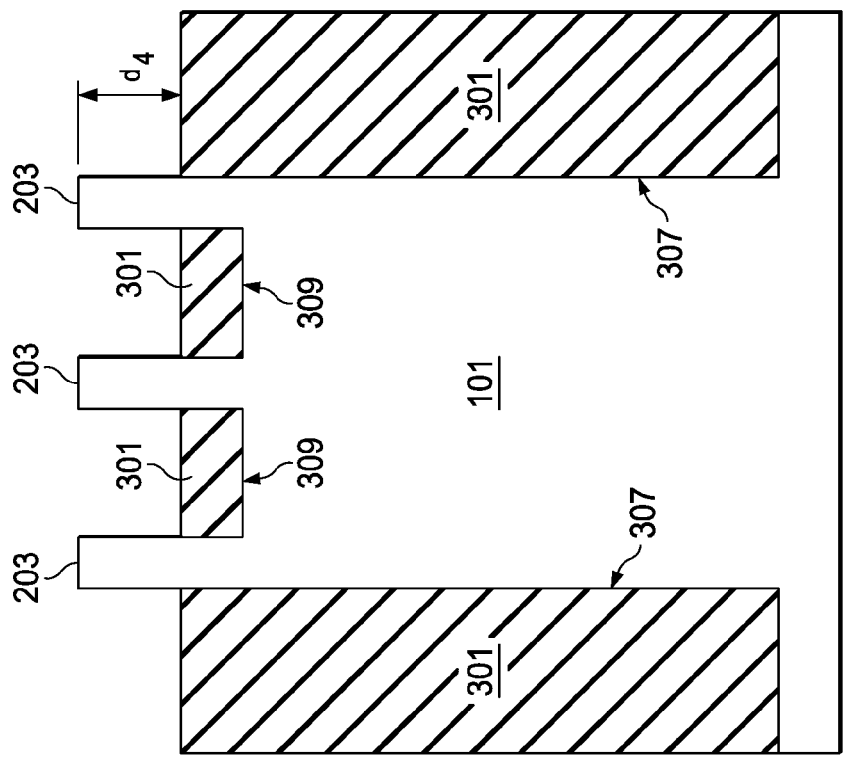
Figure 3A:
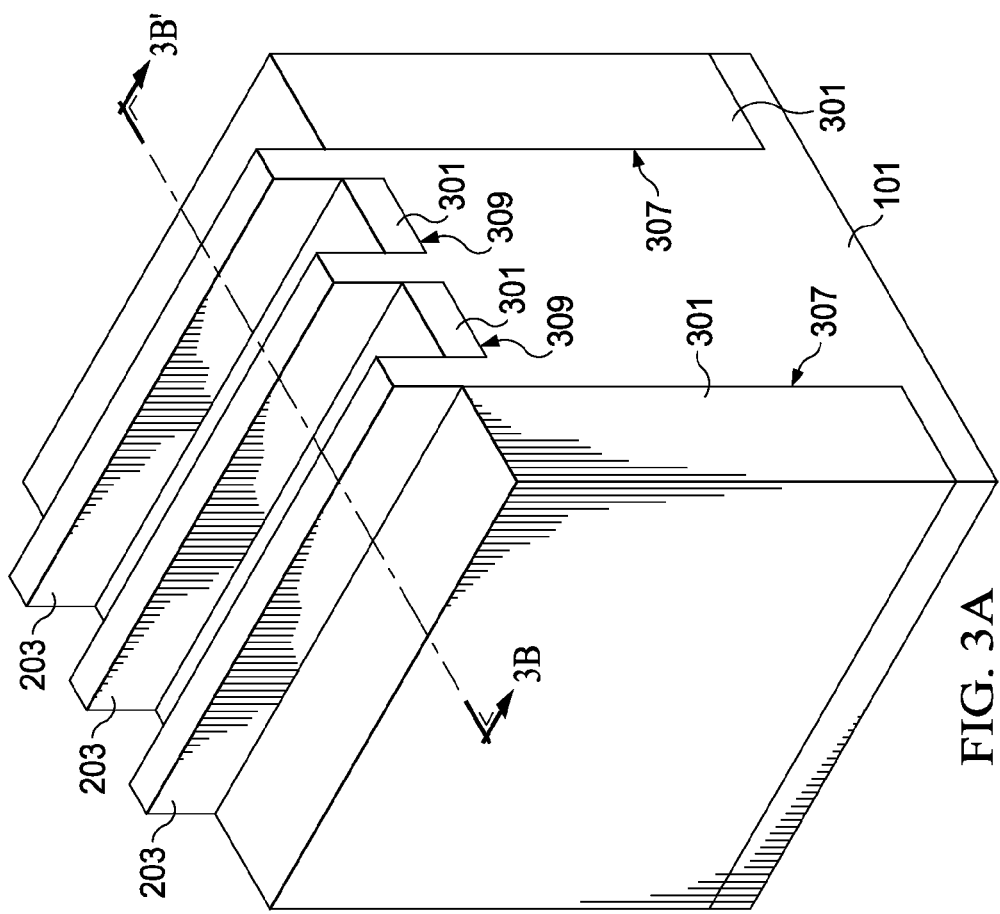

FIGS. 3A-3B illustrate the filling of the first trenches 102 and second trenches 201 with a dielectric material 301 and the recessing of the dielectric material 301 within the first trenches 102 and second trenches 201 to form first isolation regions 307 and second isolation regions 309, respectively. In this embodiment, each of the second isolation regions 309 extends into the substrate less than first isolation regions 307. The dielectric material 301 may be an oxide material, a high-density plasma (HDP) oxide, or the like. The dielectric material 301 may be formed, after an optional cleaning and lining of the first trenches 102 and second trenches 201, using either a chemical vapor deposition (CVD) method (e.g., the HARP process), a high density plasma CVD method, or other suitable method of formation as is known in the art.

The first trenches 102 and second trenches 201 may be filled by overfilling the first trenches 102 and second trenches 201 and the substrate 101 with the dielectric material 301 and then removing the excess material outside of the first trenches 102 and second trenches 201 and substrate 101 through a suitable process such as chemical mechanical polishing (CMP), an etch, a combination of these, or the like. In an embodiment, the removal process removes any dielectric material 301 that is located over the substrate 101 as well, so that the removal of the dielectric material 301 will expose the surface of the substrate 101 to further processing steps.

Once the first trenches 102 and second trenches 201 have been filled with the dielectric material 301, the dielectric material 301 may then be recessed away from the surface of the substrate 101. The recessing may be performed to expose at least a portion of the sidewalls of the fins 203 adjacent to the top surface of the substrate 101. The dielectric material 301 may be recessed using a wet etch by dipping the top surface of the substrate 101 into an etchant such as HF, although other etchants, such as $H_2$, and other methods, such as a reactive ion etch, a dry etch with etchants such as $NH_3/NF_3$, chemical oxide removal, or dry chemical clean may alternatively be used. The dielectric material 301 may be recessed to a fourth depth $d_4$ from the surface of the substrate 101 of between about 50 Å and about 500 Å, such as about 400 Å. Additionally, the recessing may also remove any leftover dielectric material 301 located over the substrate 101 to ensure that the substrate 101 is exposed for further processing.

As one of ordinary skill in the art will recognize, however, the steps described above may be only part of the overall process flow used to fill and recess the dielectric material 301. For example, lining steps, cleaning steps, annealing steps, gap filling steps, combinations of these, and the like may also be utilized to form and fill the first trenches 102 and second trenches 201 with the dielectric material 301. All of the potential process steps are fully intended to be included within the scope of the present embodiment.

Figure 4A:
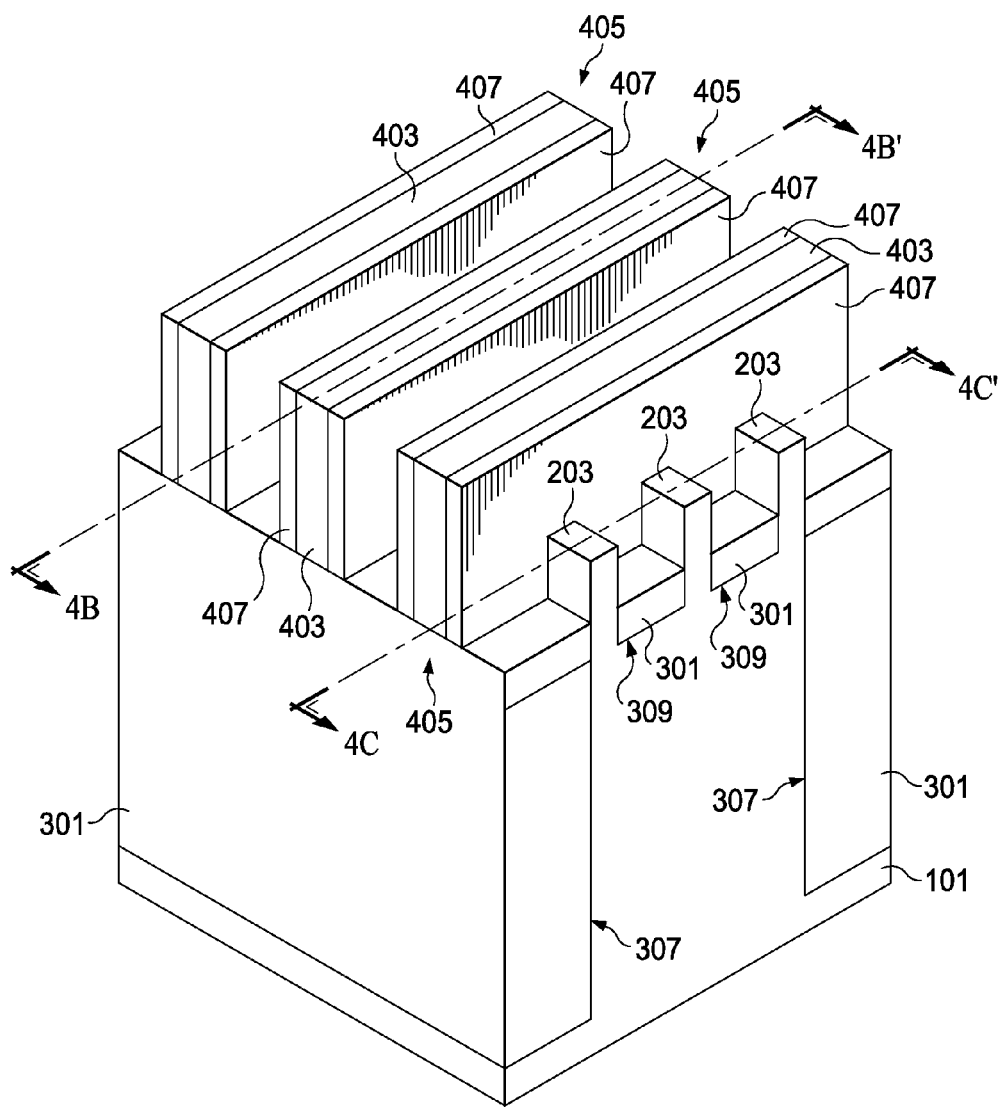
FIGS. 4A-4C illustrate the formation of gate dielectrics, gate electrodes, and spacers in accordance with an embodiment.
Figure 4C:
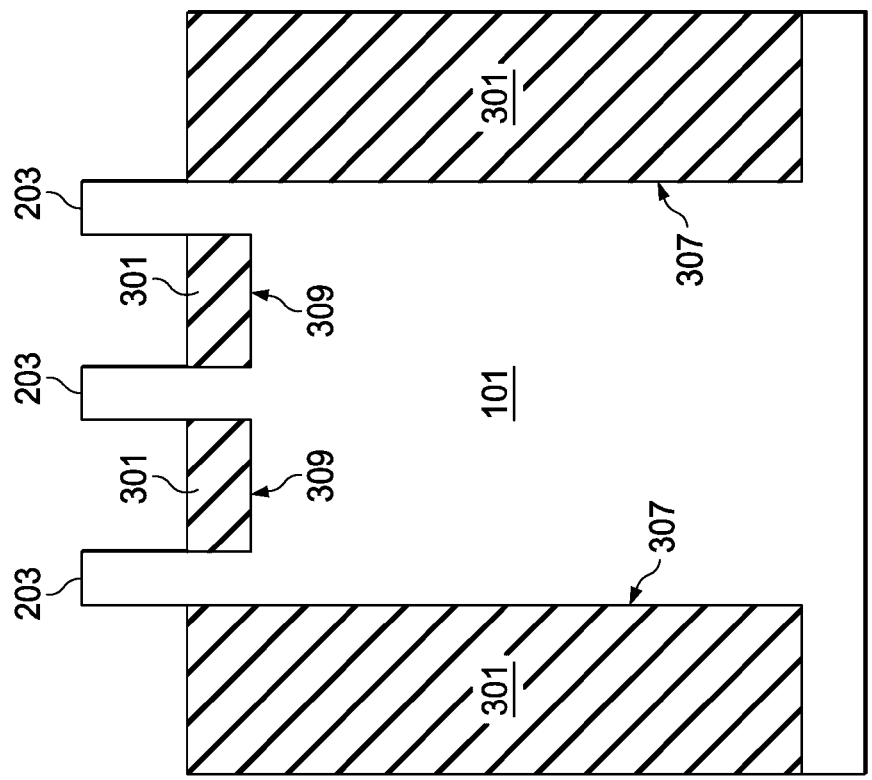
Figure 4B:
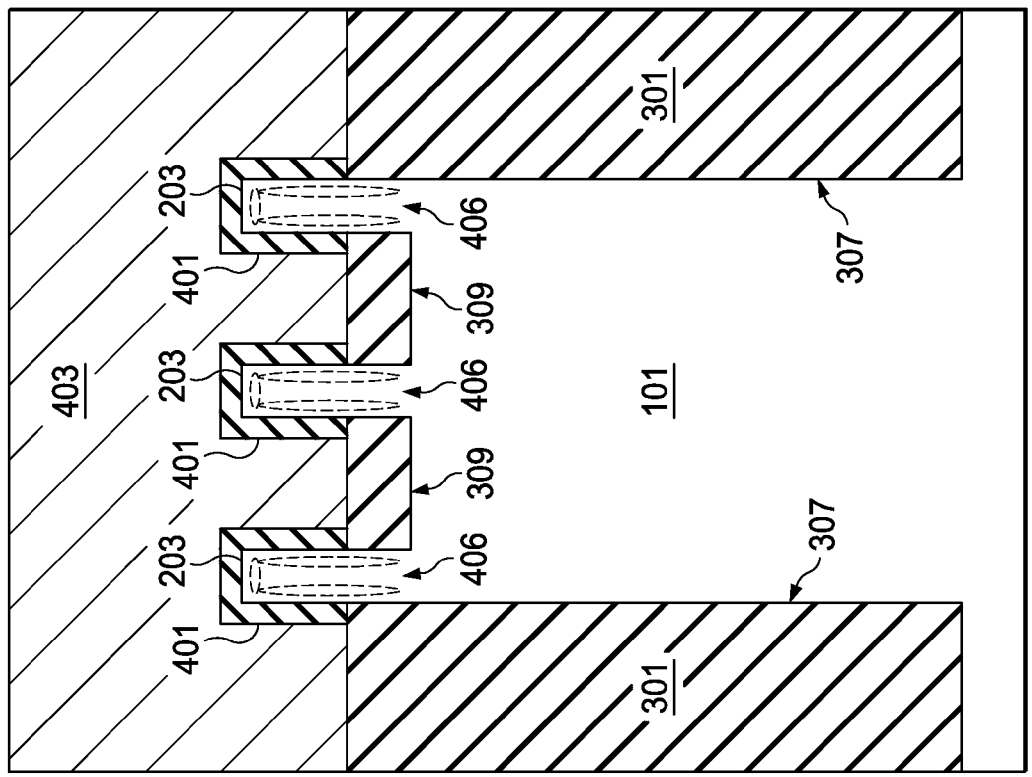

FIGS. 4A-4C illustrate the formation of a gate dielectric layer 401, gate electrode 403, and first spacers 407 over each of the fins 203. While FIG. 4B maintains the cross-sectional view along line B-B' as in FIGS. 1-3, FIG. 4C has been added as a second cross-sectional view along the line C-C' in order to illustrate a separate region of the fins 203.

The gate dielectric layer 401 (not visible in FIG. 4A but seen in FIG. 4B) may be formed by thermal oxidation, chemical vapor deposition, sputtering, or any other methods known and used in the art for forming a gate dielectric. Depending on the technique of gate dielectric formation, the gate dielectric 401 thickness on the top of the fins 203 may be different from the gate dielectric thickness on the sidewall of the fins 203.

The gate dielectric 401 may comprise a material such as silicon dioxide or silicon oxynitride with a thickness ranging from about 3 angstroms to about 100 angstroms, such as about 10 angstroms. The gate dielectric 401 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitirde, and/or high-k materials may also be used for the gate dielectric 401.

The gate electrode 403 may comprise a conductive material and may be selected from a group comprising of poly-crystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 403 may be deposited by chemical vapor deposition (CVD), sputter deposition, or other techniques known and used in the art for depositing conductive materials. The thickness of the gate electrode 403 may be in the range of about 200 angstroms to about 4,000 angstroms. The top surface of the gate electrode 403 may have a non-planar top surface, and may be planarized prior to patterning of the gate electrode 403 or gate etch. Ions may or may not be introduced into the gate electrode 403 at this point. Ions may be introduced, for example, by ion implantation techniques.

Once formed, the gate dielectric 401 and the gate electrode 403 may be patterned to form a series of gate stacks 405 over the fins 203. The gate stacks 405 define multiple channel regions 406 (roughly illustrated by dotted circles) located in the fins 203 underneath the gate dielectric 401. The gate stacks 405 may be formed by depositing and patterning a gate mask (not shown) on the gate electrode 403 using, for example, deposition and photolithography techniques known in the art. The gate mask may incorporate commonly used masking materials, such as (but not limited to) photoresist material, silicon oxide, silicon oxynitride, and/or silicon nitride. The gate electrode 403 and the gate dielectric 401 may be etched using a dry etching process to form the patterned gate stack 405.

Once gate stacks 405 are patterned, first spacers 407 may be formed. The first spacers 407 may be formed on opposing sides of the gate stacks 405. The first spacers 407 are typically formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may comprise a different material with different etch characteristics than the dielectric material 301 so that the first spacers 407 may be used as masks for the patterning of the dielectric material 301 (described below with references to FIGS. 4A-4C). The first spacers 407 may then be patterned, such as by one or more etches to remove the spacer layer from the horizontal surfaces of the structure.

Figure 5A:
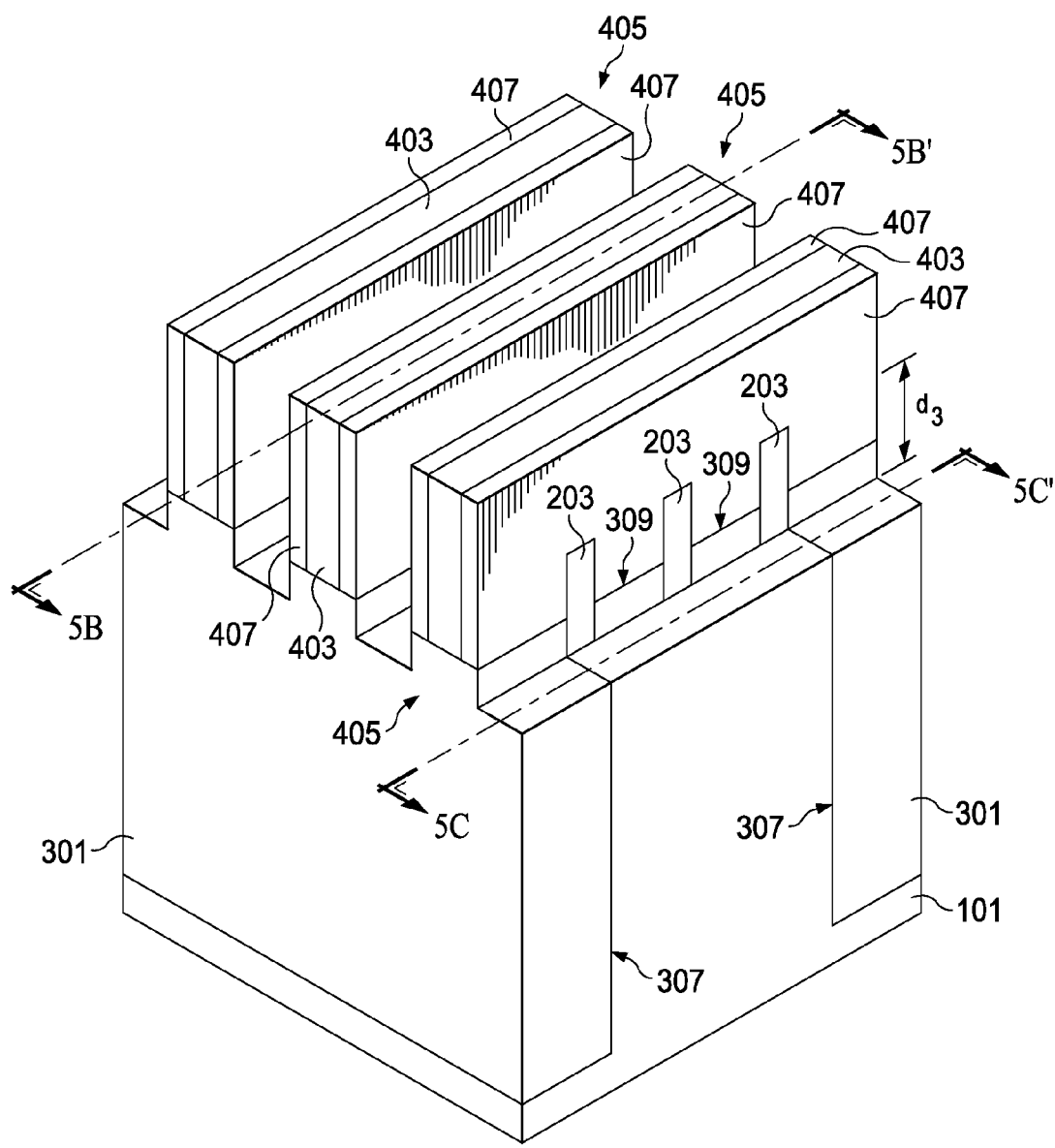
FIGS. 5A-5C illustrate the removal of a portion of the fins in accordance with an embodiment.
Figure 5C:
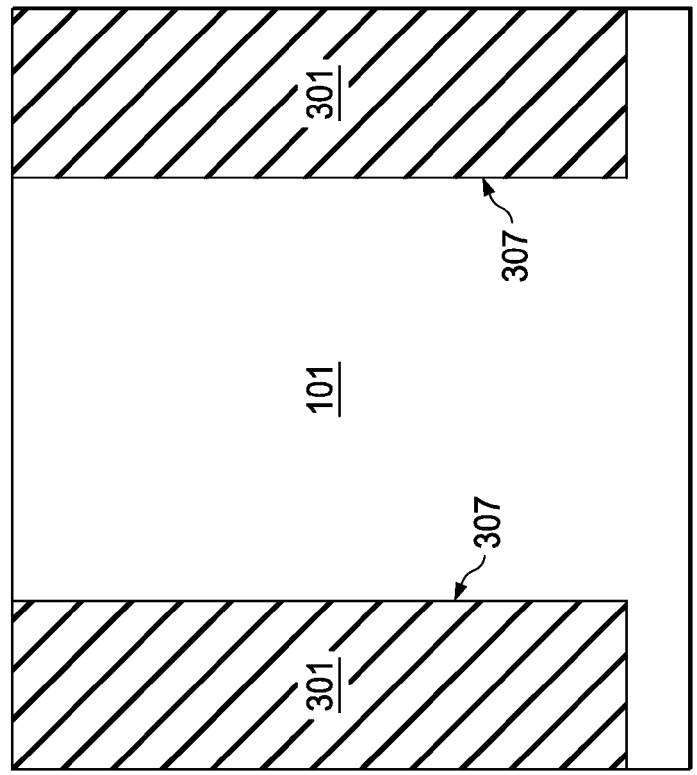
Figure 5B:
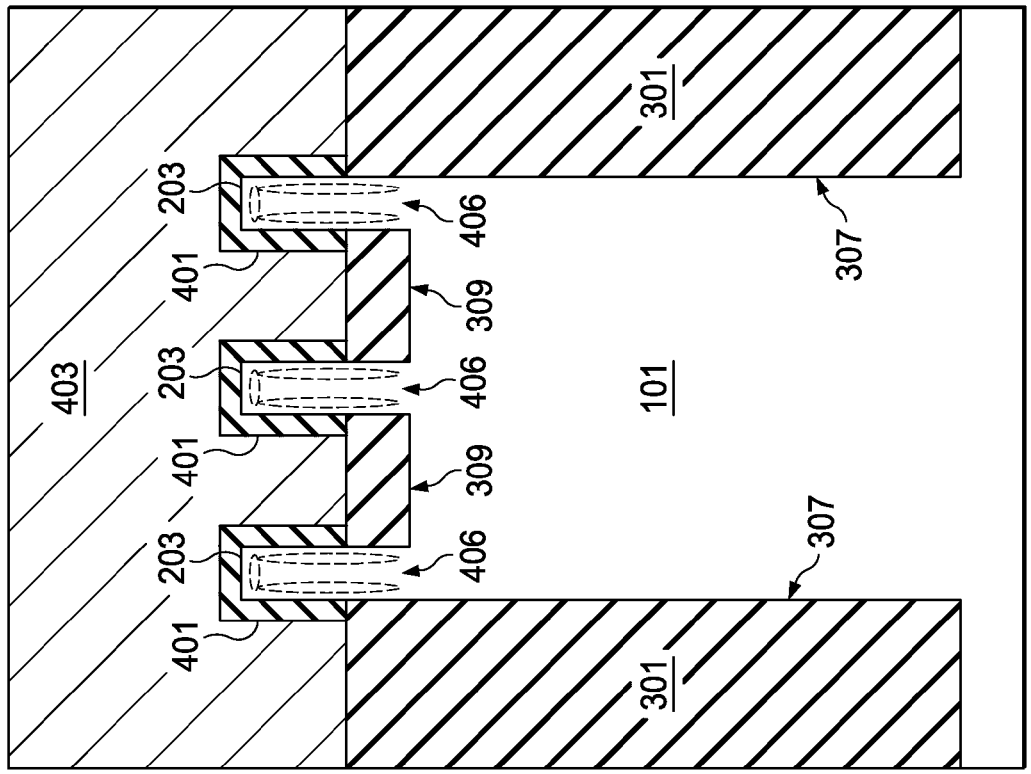

FIGS. 5A-5C illustrate the removal of the fins 203 and the dielectric material 301 from those areas not protected by the gate stacks 405 and first spacers 407. This removal may be performed by a reactive ion etch (RIE) using the gate stacks 405 and first spacers 407 as hardmasks, or by any other suitable removal process. In an embodiment, the removal removes the fins 203 and all of the dielectric material 301 from the uncovered portions of the second trenches 201 and also reduces the height of the dielectric material 301 in the first trenches to at least the third depth $d_3$ of the second trenches 201 away from the top of the fins 203. As such, the etch proceeds at least until the depth of the etch is greater than the third depth $d_3$ (see FIG. 2B) and may proceed to a depth of between about 10 nm and about 200 nm, such as about 80 nm. However, in an embodiment those portions of the fins 203 and the dielectric material 301 beneath the gate stacks 405 and first spacers 407 are left behind by the additional removal.

Figure 6A:
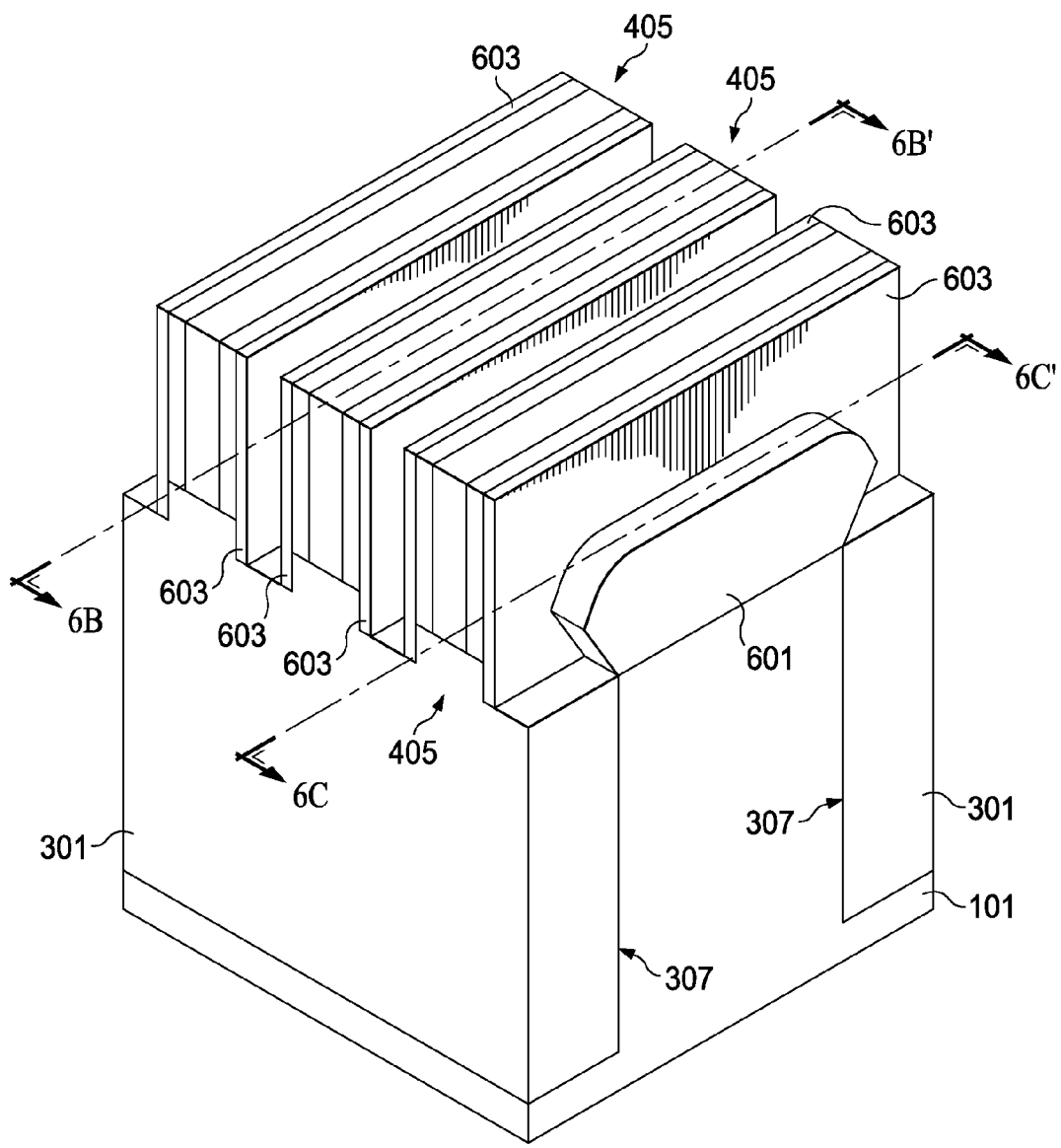
FIGS. 6A-6C illustrate the formation of a single source/drain region connecting the fins in accordance with an embodiment.
Figure 6C:
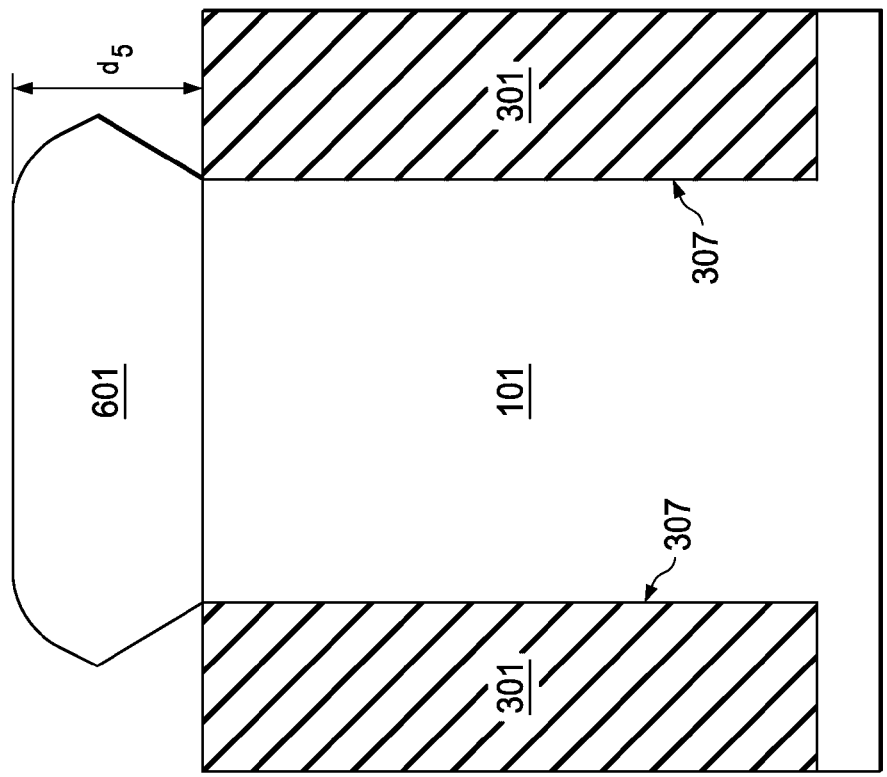
Figure 6B:
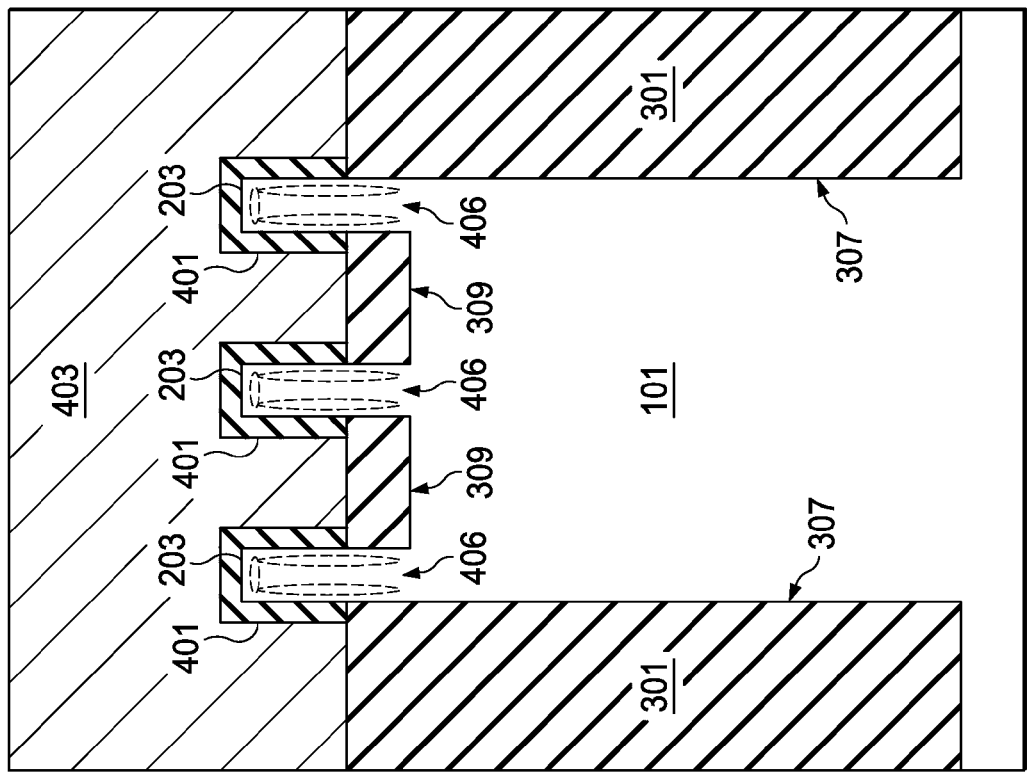

FIGS. 6A-6C illustrate the formation of single source/drain extensions 601 in contact with each of the fins 203. Once the second isolation regions 309 and fins 203 have been removed and only a surface of the substrate 101 is exposed, the single source/drain extensions 601 may be regrown to form a stressor that will impart a stress to the channel regions 406 of the fins 203 located underneath the gate stacks 405. In an embodiment wherein the fins 203 comprise silicon and the FinFET is a p-type device, the single source/drain extensions 601 may be regrown through a selective epitaxial process with a material, such as silicon germanium that has a different lattice constant than the channel regions 406. The epitaxial growth process may use precursors such as silane, dichlorosilane, germane, and the like, and may continue for between about 5 minutes and about 120 minutes, such as about 30 minutes. The source/drain extensions 601 may be formed to have a fifth height $d_5$ above the upper surface of the second isolation region 309 of between about 5 nm and about 250 nm, such as about 100 nm.

In an embodiment the silicon germanium has a germanium content of less than 100% (pure Ge), such as about 36%. The lattice mismatch between the stressor material in the single source/drain extensions 601 and the channel regions 406 will impart a stress into the channel regions 406 that will increase the carrier mobility and the overall performance of the device.

Additionally, by removing the second isolation regions 309 and the fins 203 and regrowing the single source/drain extensions 601, the voids that commonly form between the fins 203 are effectively removed, as these regions have been removed and are completely filled by the grown single source/drain extensions 601. This allows for more stress to be applied to the channel region 407, thereby improving the overall performance of the device.

FIGS. 6A-6C also illustrate the formation of optional second spacers 603 over the single source/drain extensions 601 and adjacent the first spacers 406. The second spacers 603 may be formed from similar materials and through similar processes as the first spacers 407 (described above with respect to FIGS. 4A-4C).

Once the second spacers 603 are formed, dopants may be implanted into the single source/drain extensions 601 by implanting appropriate dopants to complement the dopants in the fins 203. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the gate stacks 405, the first spacers 407, and the second spacers 603 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

After the single source/drain extensions 601 have been formed, an optional silicide process can be used to form silicide contacts (not shown) along the single source/drain extensions 601. The silicide contacts may comprise nickel, cobalt, platinum, or erbium in order to reduce the Schottky barrier height of the contact. However, other commonly used metals, such as titanium, palladium, and the like, may also be used. As is known in the art, the silicidation may be performed by blanket deposition of an appropriate metal layer, followed by an annealing step which causes the metal to react with the underlying exposed silicon. Un-reacted metal is then removed, such as through a selective etch process, and a second anneal may be performed for a silicide phase adjustment. The thickness of the silicide contacts may be between about 5 nm and about 50 nm.

Figure 7A:
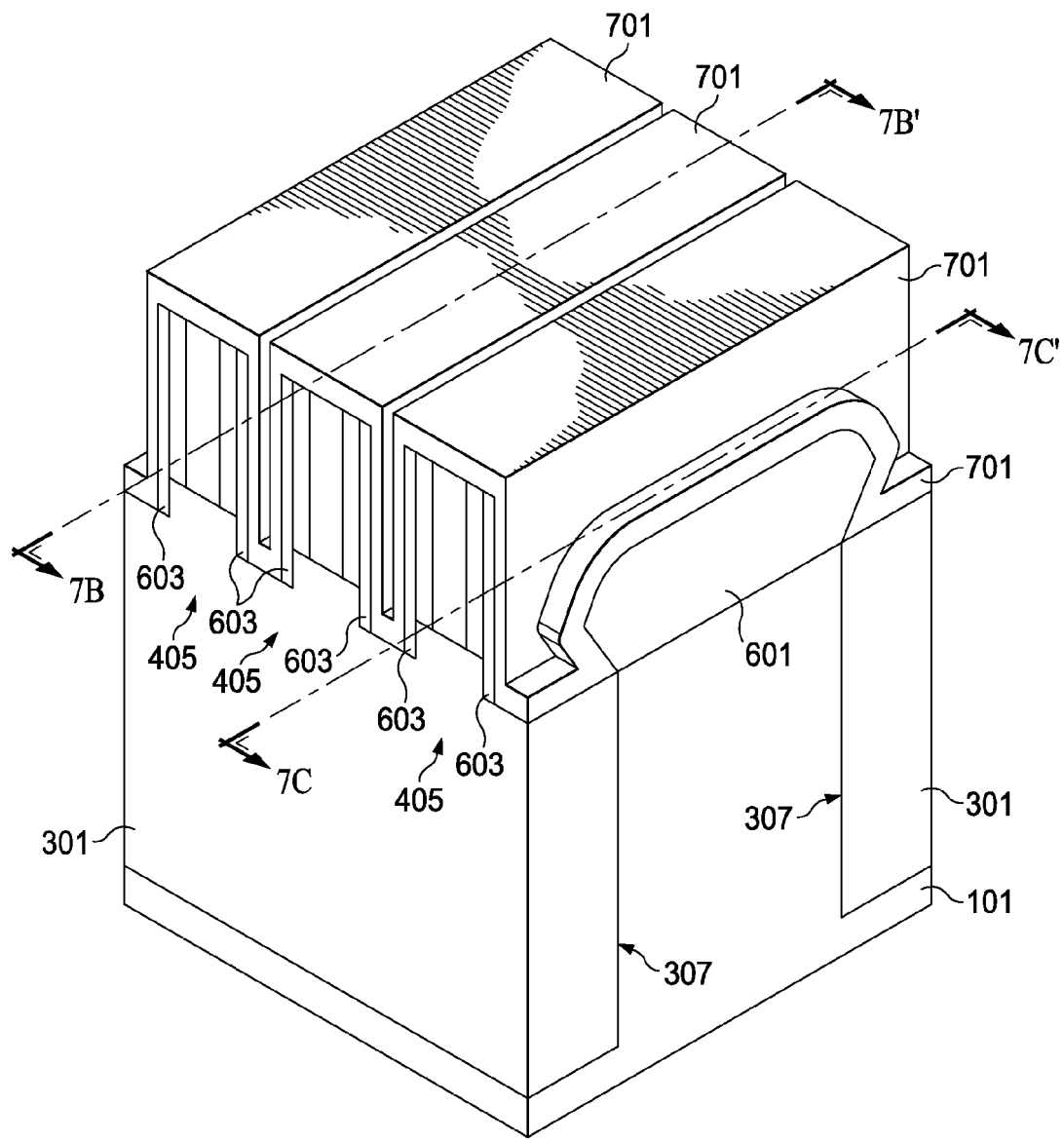

FIGS. 7A-7C illustrate the formation of a contact etch stop layer (CESL) 701 over the single source/drain extensions 601. The CESL 701 may be formed both to protect the underlying single source/drain extensions 601 as well as to provide additional strain to the channel regions 406. The CESL 701 may be formed of silicon nitride, although other materials, such as nitride, oxynitride, boron nitride, combinations thereof, or the like, may alternatively be used. The CESL 701 may be formed through CVD to a thickness of between about 5 nm and about 200 nm, such as about 80 nm. However, other methods of formation may alternatively be used. The CESL 701 may be used to impart a tensile strain to the channel regions 406 of the fins 203 for an NMOS device and to impart a compressive strain to the channel regions 406 of the fins 203 for a PMOS device.

By varying the depths of the intra-fin first isolation regions 307 and the inter-fin second isolation regions 309, removing the dielectric material 301 from a portion of the fins 203 prior to growth of the fins 203, filling the voids normally formed during growth, the stress applied to the channel can be increased, thereby increasing the overall performance of the multiple-gate transistors. For example, when three fins are utilized along with the single source/drain extension 601, the channel stress can be increased from about 470 MPa to about 658 MPa, for a on current increase of about 6-7%.

Although the present invention and its advantages have been described in detail, it should be understood that various changes, substitutions and alterations can be made herein without departing from the spirit and scope of the invention as defined by the appended claims. For example, different materials may be utilized for the source/drain stressors and the contact etch, and different processes may be used to form the source/drain extensions.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a substrate;
   forming a plurality of fins in the substrate;
   forming first isolation regions in the substrate, the first isolation regions extending a first depth from a surface of the substrate;
   forming second isolation regions in the substrate, the second isolation regions extending a second depth from the surface of the substrate, the second depth being less than the first depth;
   forming a gate dielectric, gate electrode, and spacers over a first portion of each of the semiconductor fins and the second isolation regions while leaving a second portion of each of the semiconductor fins and the second isolation regions exposed;
   removing the second portion of each of the semiconductor fins and the second isolation regions; and
   forming a source/drain region, the source/drain region connecting the plurality of semiconductor fins and extending below a top surface of the second isolation regions.

2. The method of claim 1, wherein the forming a source/drain region is done at least in part through an epitaxial growth process.

3. The method of claim 1, further comprising forming a contact etch stop layer over the source/drain region.

4. The method of claim 1, wherein the removing the second portion of each of the semiconductor fins and the second isolation regions further comprises recessing a portion of the first isolation regions.

5. The method of claim 4, further comprising forming second spacers in contact with the portion of the first isolation regions.

6. The method of claim 1, wherein the forming a source/drain region further comprises epitaxially growing the source/drain region to extend over the first isolation regions.

7. The method of claim 1, wherein the forming first isolation regions further comprises:
   forming first trenches;
   filling the first trenches with a dielectric material; and
   recessing the dielectric material within the first trenches.

8. A method of forming a semiconductor device, the method comprising:
   forming a first isolation region in a substrate between a first fin and a second fin;
   forming a second isolation region in the substrate on an opposite side of the first fin from the first isolation region, wherein the second isolation region extends further into the substrate than the first isolation region;
   forming a gate stack over the first fin and the second fin;
   removing an exposed first portion of the first fin and an exposed second portion of the second fin, wherein the removing the exposed first portion of the first fin continues until the first portion of the first fin is below a top surface of the first isolation region; and
   growing a continuous source/drain region extending from the first fin to the second fin.

9. The method of claim 8, wherein the growing the continuous source/drain region is done at least in part through an epitaxial growth process.

10. The method of claim 8, further comprising depositing a contact etch stop layer over the continuous source/drain region.

11. The method of claim 8, wherein the removing the exposed first portion of the first fin further comprises recessing a portion of the second isolation region.

12. The method of claim 11, further comprising forming second spacers in contact with the second isolation regions.

13. The method of claim 8, wherein the growing a continuous source/drain region further comprises epitaxially growing the source/drain region to extend over the second isolation region.

14. The method of claim 8, wherein the forming a second isolation region further comprises:
   forming a first trench;
   filling the first trench with a dielectric material; and
   recessing the dielectric material within the first trench.

15. A method of forming a semiconductor device, the method comprising:
   depositing dielectric material into a first opening and a second opening, wherein the first opening is located between a first fin and a second fin and wherein the second opening is not located between the first fin and the second fin, the first opening extending into the substrate less than the second opening;
   recessing the dielectric material such that sidewalls of the first fin and the second fin are exposed;
   forming a gate stack over the first fin and the second fin;
   removing the dielectric material from a first region in the first opening exposed by the gate stack; and
   growing a source/drain region within the first region, the source/drain region extending between the first fin and the second fin.

16. The method of claim 15, wherein the growing the source/drain region is done at least in part through an epitaxial growth process.

17. The method of claim 15, further comprising forming a contact etch stop layer over the source/drain region.

18. The method of claim 15, further comprising forming spacers in contact with the dielectric material after the growing the source/drain region.

19. The method of claim 15, wherein the growing the source/drain region further comprises epitaxially growing the source/drain region to extend over the second opening.

20. The method of claim 15, wherein the removing the dielectric material from a first region exposed by the gate stack further removes the dielectric material from a second region in the second opening exposed by the gate stack.

* * * * *